United States Patent [19]

Kirisawa

[11] Patent Number: 5,392,238
[45] Date of Patent: Feb. 21, 1995

[54] NONVOLATILE SEMICONDUCTOR MEMORY DEVICE

[75] Inventor: Ryouhei Kirisawa, Yokohama, Japan

[73] Assignee: Kabushiki Kaisha Toshiba, Kawasaki, Japan

[21] Appl. No.: 226,474

[22] Filed: Apr. 11, 1994

[30] Foreign Application Priority Data

Apr. 12, 1993 [JP] Japan ................... 5-084497

[51] Int. Cl.⁶ .............................................. G11C 11/40
[52] U.S. Cl. ....................... 365/185; 365/63; 365/72; 365/230.03; 365/242
[58] Field of Search ............ 365/185, 900, 230.03, 365/242, 63, 72

[56] References Cited

U.S. PATENT DOCUMENTS

| | | | |
|---|---|---|---|
| 5,197,027 | 3/1993 | Chalia | 365/185 |
| 5,293,337 | 3/1994 | Aritome et al. | 365/185 |
| 5,295,096 | 3/1994 | Nakajima | 365/900 |
| 5,299,166 | 3/1994 | Suh et al. | 365/185 |

FOREIGN PATENT DOCUMENTS 3-283660  12/1991  Japan .

Primary Examiner—Eugene R. LaRoche
Assistant Examiner—Tan Nguyen
Attorney, Agent, or Firm—Finnegan, Henderson, Farabow, Garrett & Dunner

[57] ABSTRACT

A semiconductor nonvolatile memory device according to the invention comprises a first cell block having with a current path and a plurality of memory cells, a second cell block having with a current path and a plurality of memory cells, the current path of the second cell block has an end connected to a corresponding end of the current path of the first cell block, a first line electrically connected to the other end of the current path of the first cell block, and a second line electrically connected to the other end of the current path of the second cell block. The first and second lines are made to operate a bit line and a source line, or vise versa, depending on which one of said cell blocks is selected for data retrieval.

7 Claims, 18 Drawing Sheets

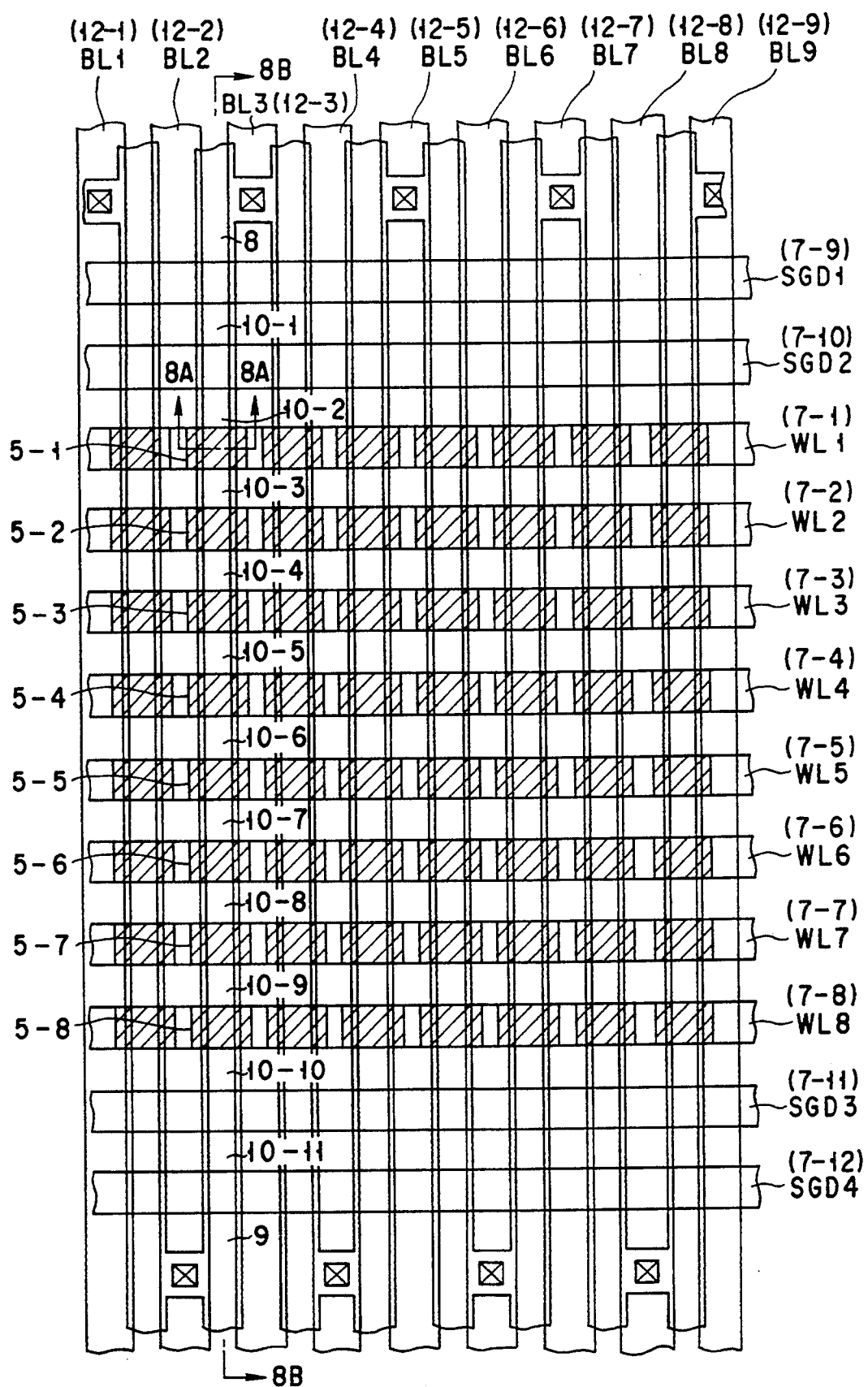
F I G. 7

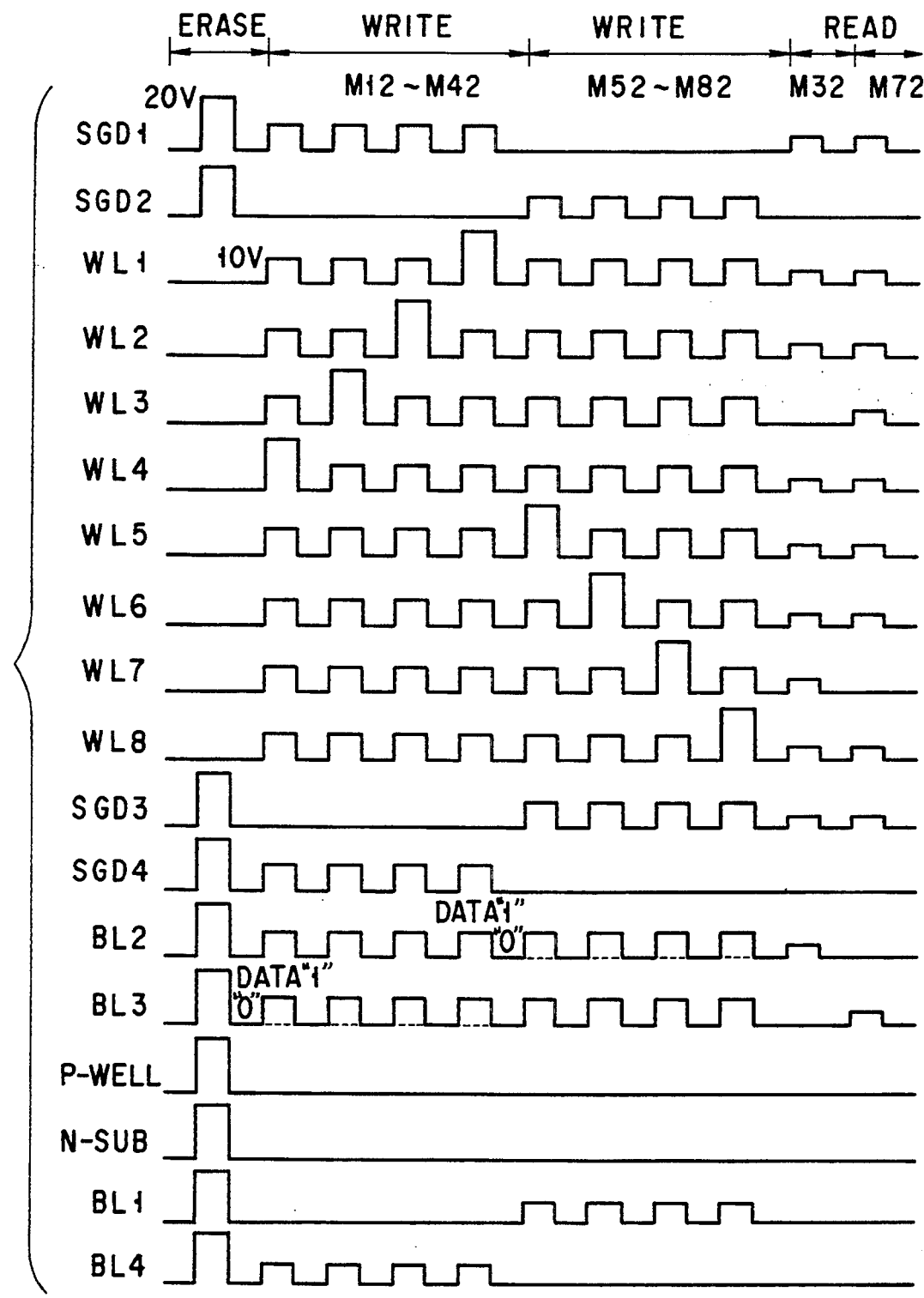
F I G. 12

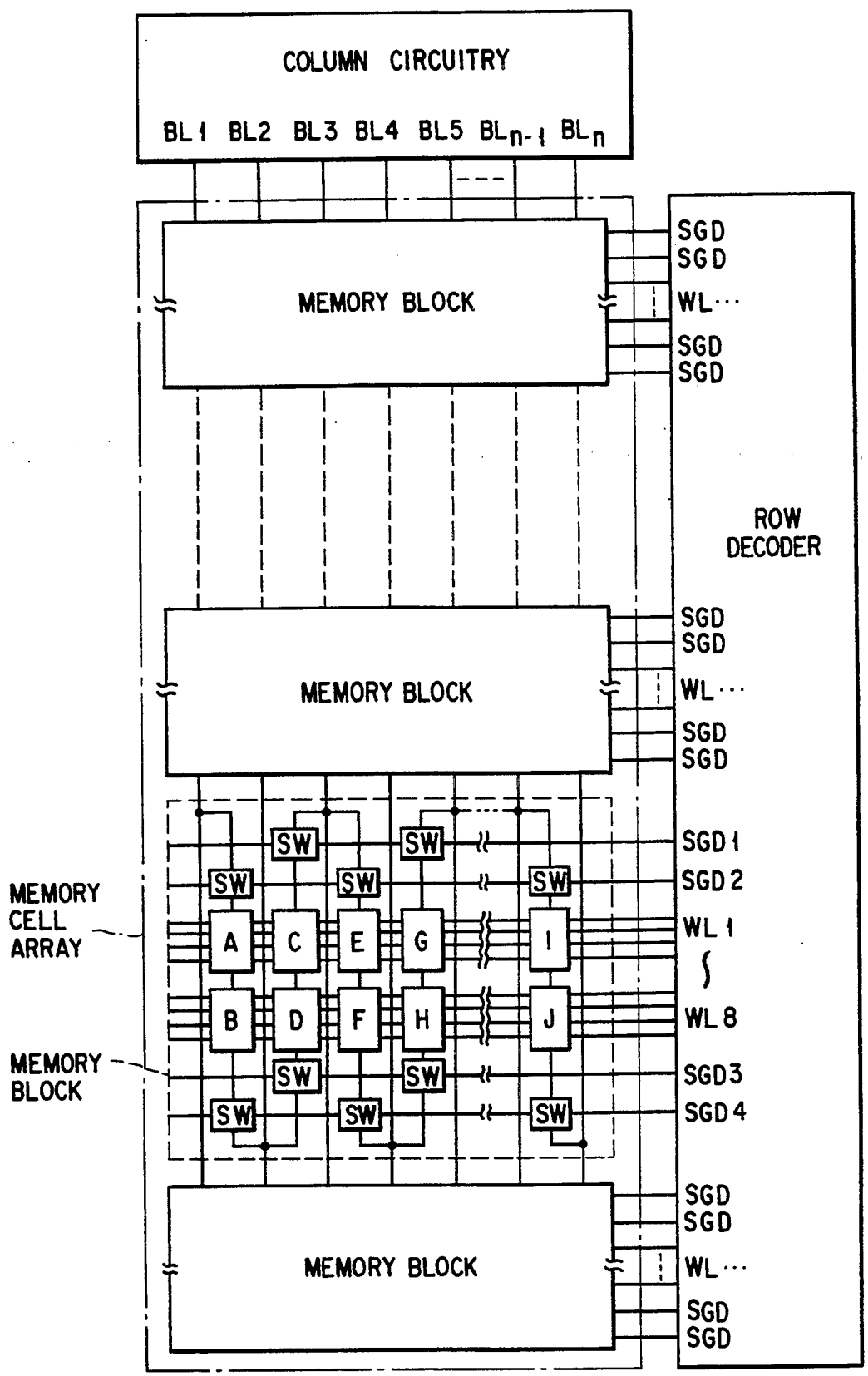
F I G. 13

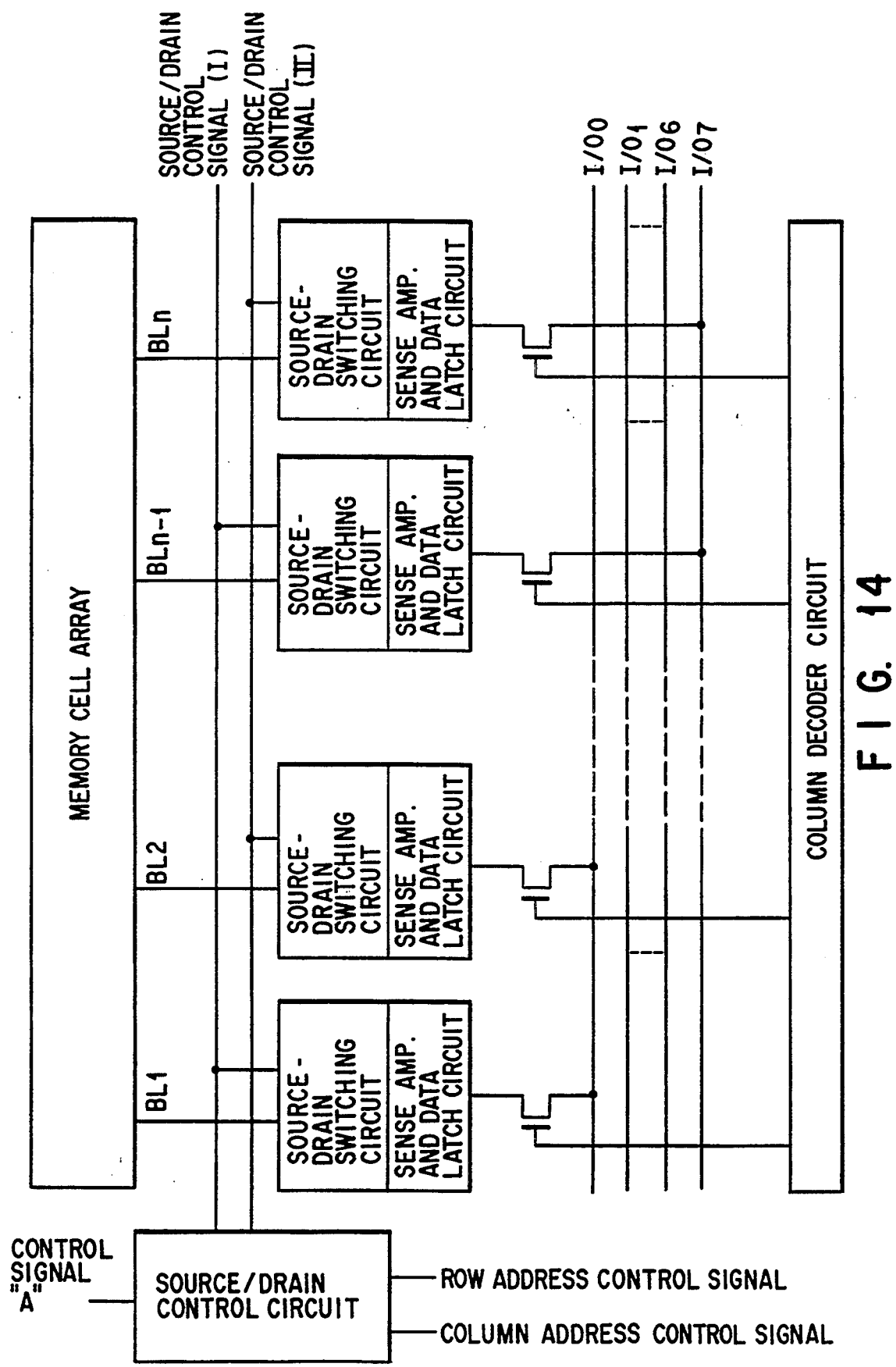
F I G. 14

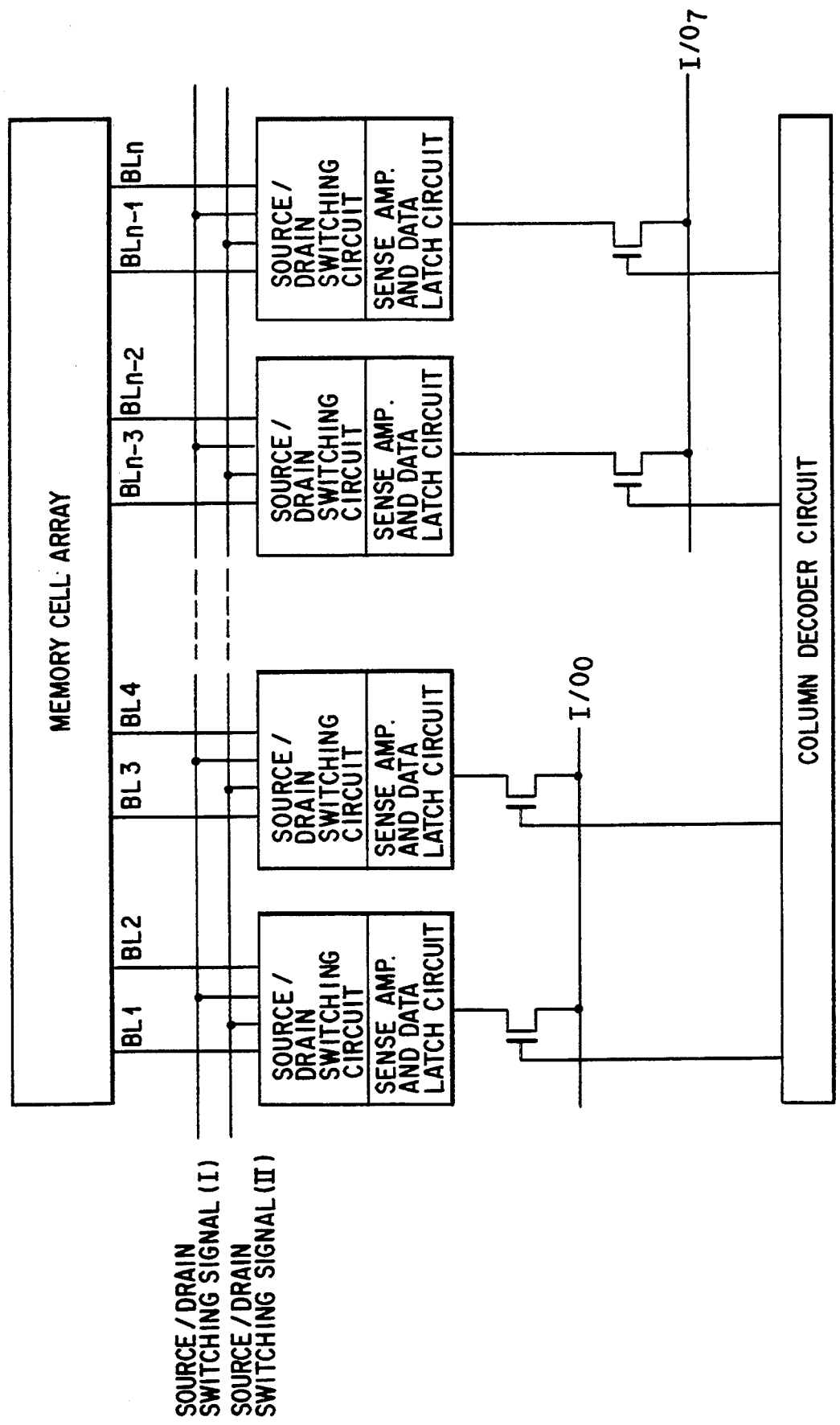
F I G. 19

NONVOLATILE SEMICONDUCTOR MEMORY DEVICE

BACKGROUND OF THE INVENTION

1. Field of the Invention

This invention relates to a semiconductor nonvolatile memory device and, more particularly, it relates to a semiconductor nonvolatile memory device comprising memory cell blocks such as NAND cell blocks.

2. Description of the Related Art

There are known semiconductor nonvolatile memory devices comprising NAND cell blocks each of which is constituted by a plurality of memory cells. Hereinafter, such a memory device will be referred to as an NAND type EEPROM.

FIGS. 1 through 3B of the accompanying drawings illustrate part of a typical known NAND-type EEPROM, of which FIG. 1 is a circuit diagram and FIG. 2 is a patternized plan view of the part of the device of FIG. 1 while FIGS. 3A and 3B are sectional views taken along lines 3A—3A and 3B—3B of FIG. 2 respectively.

As shown in FIGS. 1 through 3B, a P-type well region 2 is formed on an N-type silicon substrate 1. A NAND cell block is arranged on an element region which is disposed on the well region 2 and surrounded by an element separating insulation film 3, said NAND cell block comprising four memory cells Ma through Md and a pair of selection gate S1, S2. The memory cells Ma through Md comprises respective floating gates 5-1 through 5-4 (or collectively designated by reference numeral 5) made of a first layer polycrystalline silicon film arranged on a first gate insulation film 4 that is formed by thermal oxidation on the well region 2 and respective control gates 7-1 through 7-4 (or collectively designated by reference numeral 7) made of a second layer polycrystalline silicon film arranged on the respective floating gates 5-1 through 5-4.

The control gates 7 of the memory cells are extended along the row to form respective word lines WL1 through WL4. Gate electrodes 7-5, 7-6 of the selection gates S1, S2 are connected to respective selection control lines SGD, SGS. An N-type drain diffusion layer 8 is formed for the NAND cell blocks and connected to a common bit line BL (BL1), whereas an N-type source diffusion layer 9 is formed as a common source line SL for the NAND cell blocks. The selection gate S1 and the memory cell Ma are electrically connected with each other by an N-type diffusion layer 10-1, the memory cell Ma and the memory cell Mb are electrically connected with each other by an N-type diffusion layer 10-2 and so on. The memory cell Md and the selection gate S2 are electrically connected with each other by an N-type diffusion layer 10-5.

A NAND-type EEPROM having the above described configuration operates in a manner as described below.

FIG. 4 of the accompanying drawings is a timing chart illustrating the operation of such a NAND-type EEPROM.

A threshold voltage is established for the memory cells of a NAND cell block by applying a high voltage between the control gates and the well region 2 to force an exchange of electric charges between the floating gates 5 and the well region 2. For example, data may be erased when electrons are discharged form the floating gates 5 to the well region 2 (data "1" status), whereas data may be written when electrons are injected into the floating gates 5 (data "0" status).

Data may be erased out of each of the memory cells. Referring to FIG. 4, if such is the case, the voltage applied to erase data is so biased that, for example, it is 0 V at the control gates (or WL1 through WL4 in FIG. 4), 20 V at the well region (or P-WELL in FIG. 4) and at the substrate (or N-SUB in FIG. 4), 20 V at the first selection gate S1 (or SGD in FIG. 4) and 20 V at the second selection gate S2 (or SGS in FIG. 4). Thus, the threshold voltage level is shifted into negative for the memory cells and may be set to, for example, −2 V.

Data are written in the memory cells sequentially starting from the memory cell close to the source 9 and terminating at the memory cell close to the bit line. As shown in FIG. 4, the voltage applied to write data is again so biased that, for example, it is 20 V at the control gate of a selected memory cell (or WL4 in FIG. 4), an intermediate value of 10 V at the remaining control gates (or WL1 through WL3 in FIG. 4), 0 V at the well region (or P WELL in FIG. 4) and at the substrate (or N SUB in FIG. 4), 10 V at the first selection gate S1 (or SGD in FIG. 4) and 0 V at the second selection gate S2 (or SGS in FIG. 4). The voltage at the bit line (or BL1 in FIG. 4) will show an intermediate value of 10 V when the data is "1" whereas it will be 0 V when the data is "0".

Note that, in the case of FIG. 4, data are written in the memory cells sequentially starting from the memory cell close to the source 9 and terminating at the memory cell close to the bit line.

FIG. 4 also shows the voltage applied to the cell block for retrieving the data stored in it. It will be, for example, 5 V at a selected bit line (or BL1 in FIG. 4) and also 5 V at the selection gates S1 and S2 (or SGD and SGS respectively in FIG. 4). Then, both selection gates S1 and S2 become electrically conductive to connect the NAND cell block to the bit lines BL. Under this condition, only a selected word line (or WL3 in FIG. 4) is held to 0 V, while the remaining word lines (or WL1, WL2 and WL4 in FIG. 4) are set to 5 V. Then, the unselected memory cells M1, M2 and M4 operate as so many transfer gates such that data "0" or "1" is detected depending on the existence or non-existence of electric current on the bit line BL1.

Alternatively, the data stored in each cell block of a NAND-type EEPROM of the type under consideration may be erased collectively. When all the data stored in a cell block are erased collectively, the voltage of the word lines of the remaining NAND cell blocks whose data are not to be erased is held to 20 V, which is the voltage level of the related well regions. Then, the data stored in the NAND cell blocks held under such a biased voltage condition cannot be erased and are securely stored there.

A known NAND-type EEPROM having the above described configuration requires a source line for a pair of NAND cell blocks. Additionally, the source of the device has a large electric resistance because it is made of a diffusion layer. In an attempt to reduce the resistance, a metal line is connected to the source diffusion layer for every several NAND cell blocks. This means that a relatively large space is required to connect the metal line and the source diffusion layer.

Furthermore, a contact is required for each NAND cell block to be connected with a bit line, meaning that a certain additional space is needed to align the metal line and the contact for the bit line.

All these circumstances provide so many difficulties in realizing a high degree of integration and compactness for conventional NAND-type EEPROMs.

Still additionally, if the number of memory cells in a NAND cell block of a conventional NAND-type EEPROM is increased, so many memory cells of a cell block are collectively subjected to data erasure.

SUMMARY OF THE INVENTION

In view of the above identified problems and other problems of conventional NAND-type EEPROMs, it is therefore an object of the invention to provide an NAND-type semiconductor nonvolatile memory device suited for a high degree of integration.

Another object of the invention is to provide an efficient method of operation for a semiconductor nonvolatile memory device of the above defined type.

According to the invention, these objects are achieved by providing a semiconductor nonvolatile memory device comprising:

a first cell block having a current path and a plurality of memory cells;

a second cell block having a current path and a plurality of memory cells, the current path of the second cell block having an end connected to a corresponding end of the current path of the first cell block;

a first line electrically connected to the other end of the current path of the first cell block;

a second line electrically connected to the other end of the current path of the second cell block; and means for causing the first and second lines to operate as a bit line and a source line, respectively, depending on which one of the cell blocks is selected for data retrieval.

With an arrangement as described above, as the first and second lines are switched for the bit and source lines depending on which one of a pair of cell blocks of a memory device is selected for data retrieval, no source lines need to be independently and exclusively provided for the device. Consequently, no contact holes are required to accommodate such source lines. The net result is a memory device particularly suited for an enhanced degree of integration.

The above second object of the invention is achieved by arranging the first and second lines of a semiconductor nonvolatile memory device described above so as to use them respectively as a source line and a bit line, in order to retrieve the data stored in one of the memory cells of the first cell block.

With such an arrangement, the line located closer to the first cell block operates as a source line when said cell block is selected for data retrieval while the second line located away from the selected first cell block functions as a bit line. The resistance between the source line and the selected cell block can be therefore reduced significantly. Hence, data can be read from the selected cell block at high speed. Since the resistance between the source line and the cell block can be low, a rise, if any, in the source potential can be minimized to increase a potential difference required for discriminate the data. The data can, therefore, be read not only fast but also accurately.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a patternized plan view of the embodiment of FIG. 5;

FIG. 12 is a timing chart illustrating an alternative method of operating the second embodiment of FIG. 10;

FIG. 13 is a floor plan view of a NAND-type EEPROM according to the present invention;

FIG. 14 is a block diagram of the column circuitry shown in FIG. 13;

FIG. 19 is a block diagram of another embodiment of the column circuitry shown in FIG. 13.

DETAILED DESCRIPTION OF THE PREFERRED EMBODIMENTS

Now, the present invention will be described in greater detail by referring to the accompanying drawings that illustrate preferred embodiments of the invention. Throughout the drawings, same components are respectively denoted by same reference symbols and any repeated description thereof will be avoided.

Figure 1:
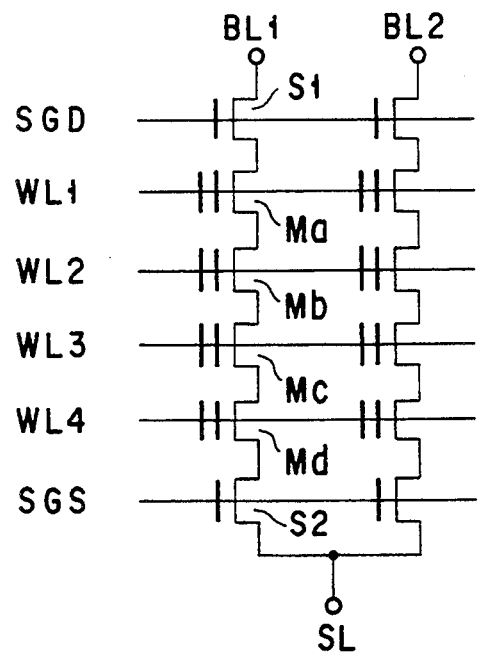
FIG. 1 is a circuit diagram of a typical known NAND-type EEPROM.
Figure 2:
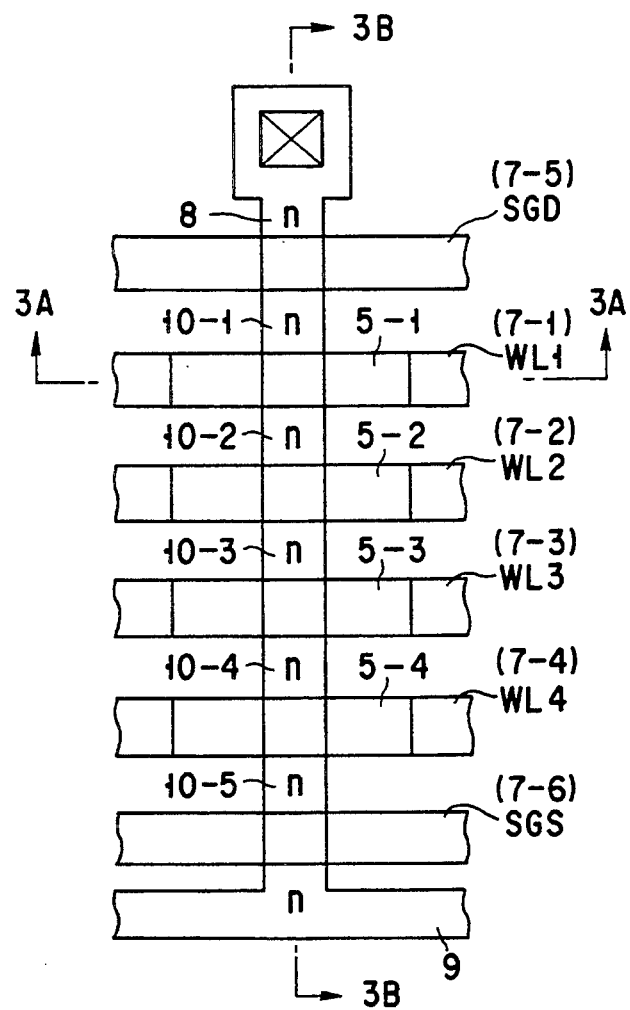
FIG. 2 is a patternized plan view of the NAND-type EEPROM of FIG. 1.
Figure 3A:
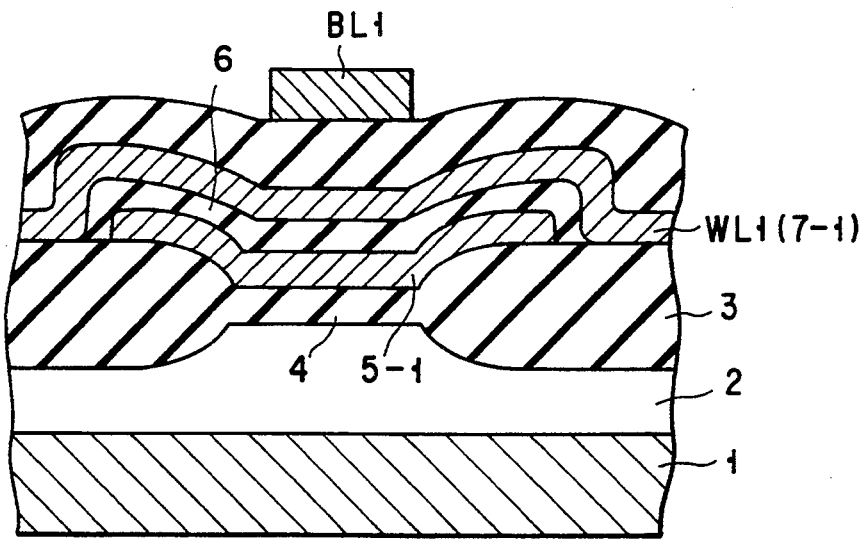
FIG. 3A is a sectional view taken along line 3A—3A of FIG. 2.
Figure 3B:
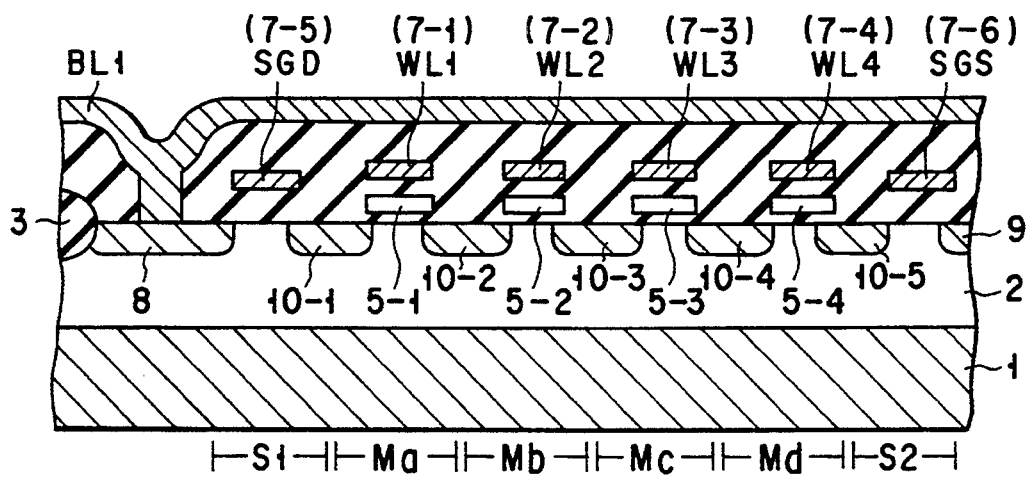
FIG. 3B is a sectional view taken along line 3B—3B of FIG. 2.
Figure 4:
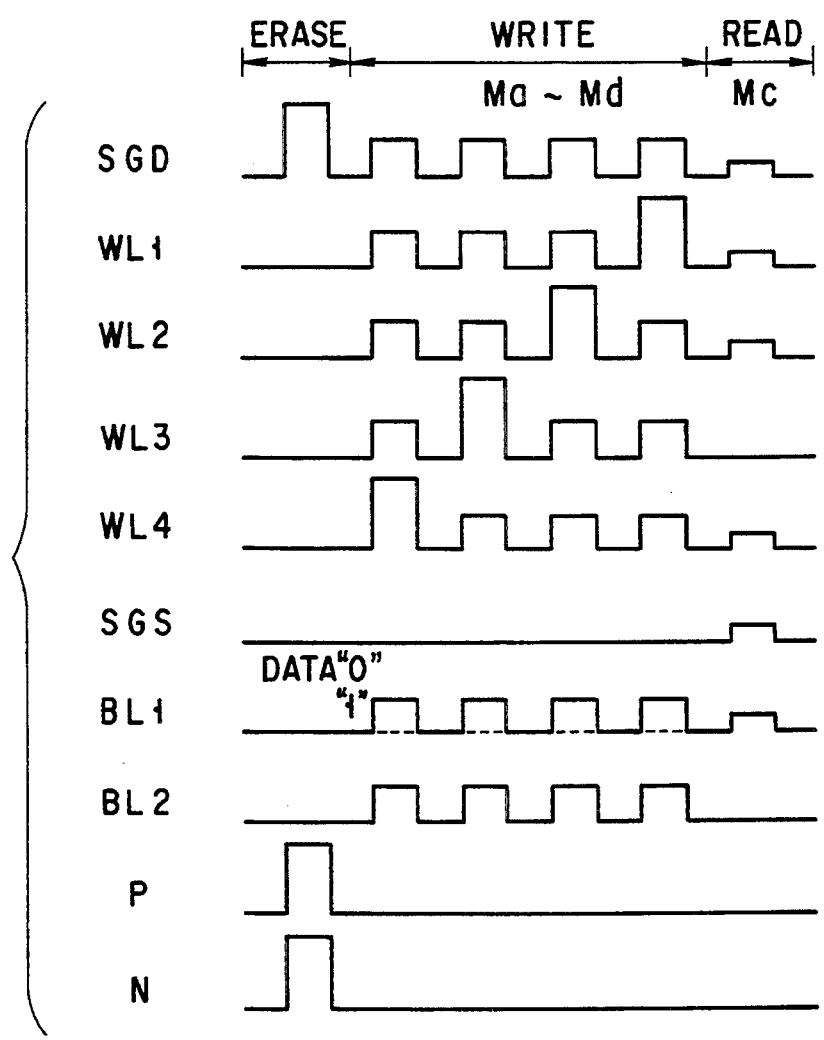
FIG. 4 is a timing chart illustrating the operation of the NAND type EEPROM of FIG. 1.
Figure 5:
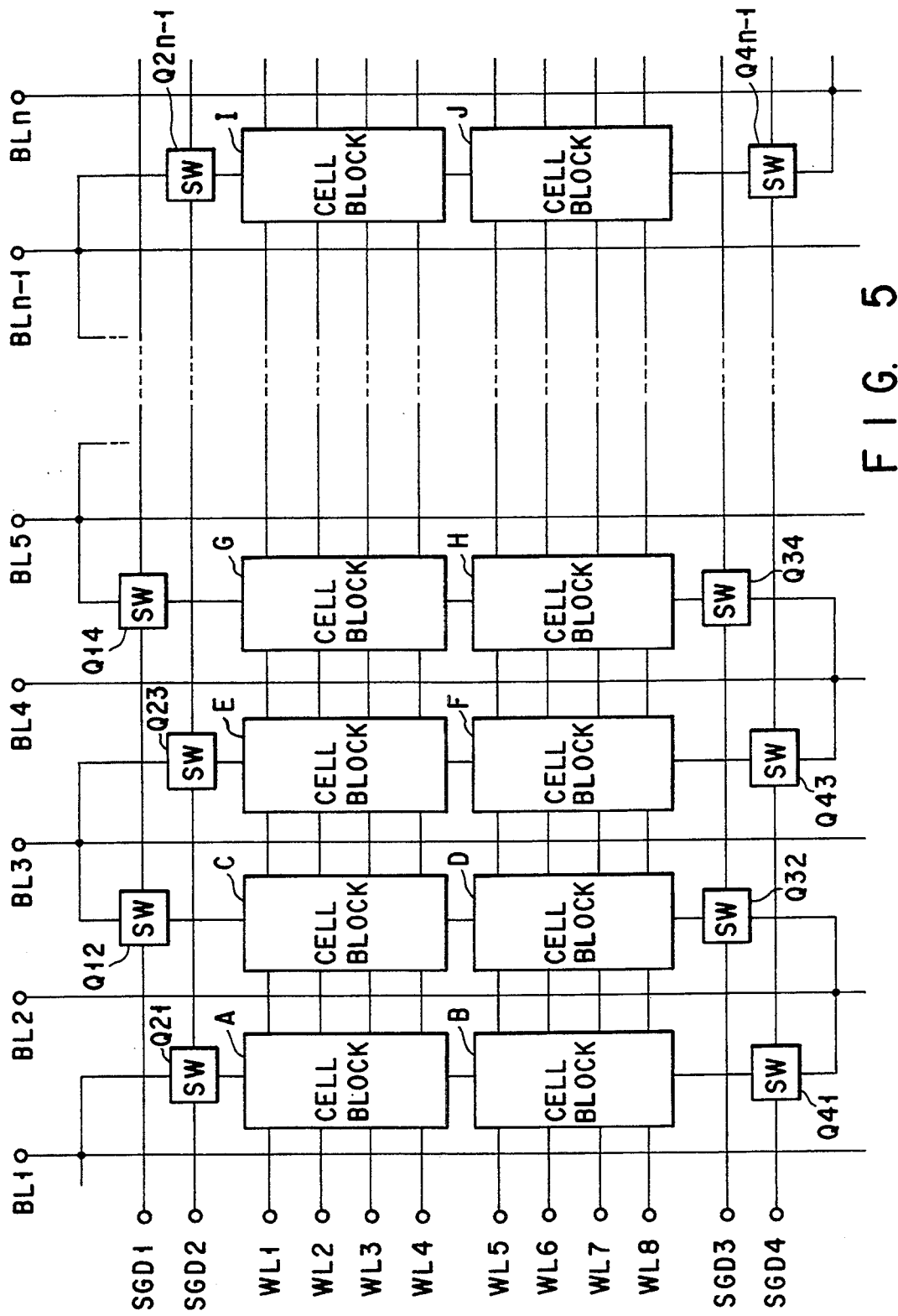
FIG. 5 is a block diagram of a first embodiment of NAND-type EEPROM according to the invention.
Figure 6:
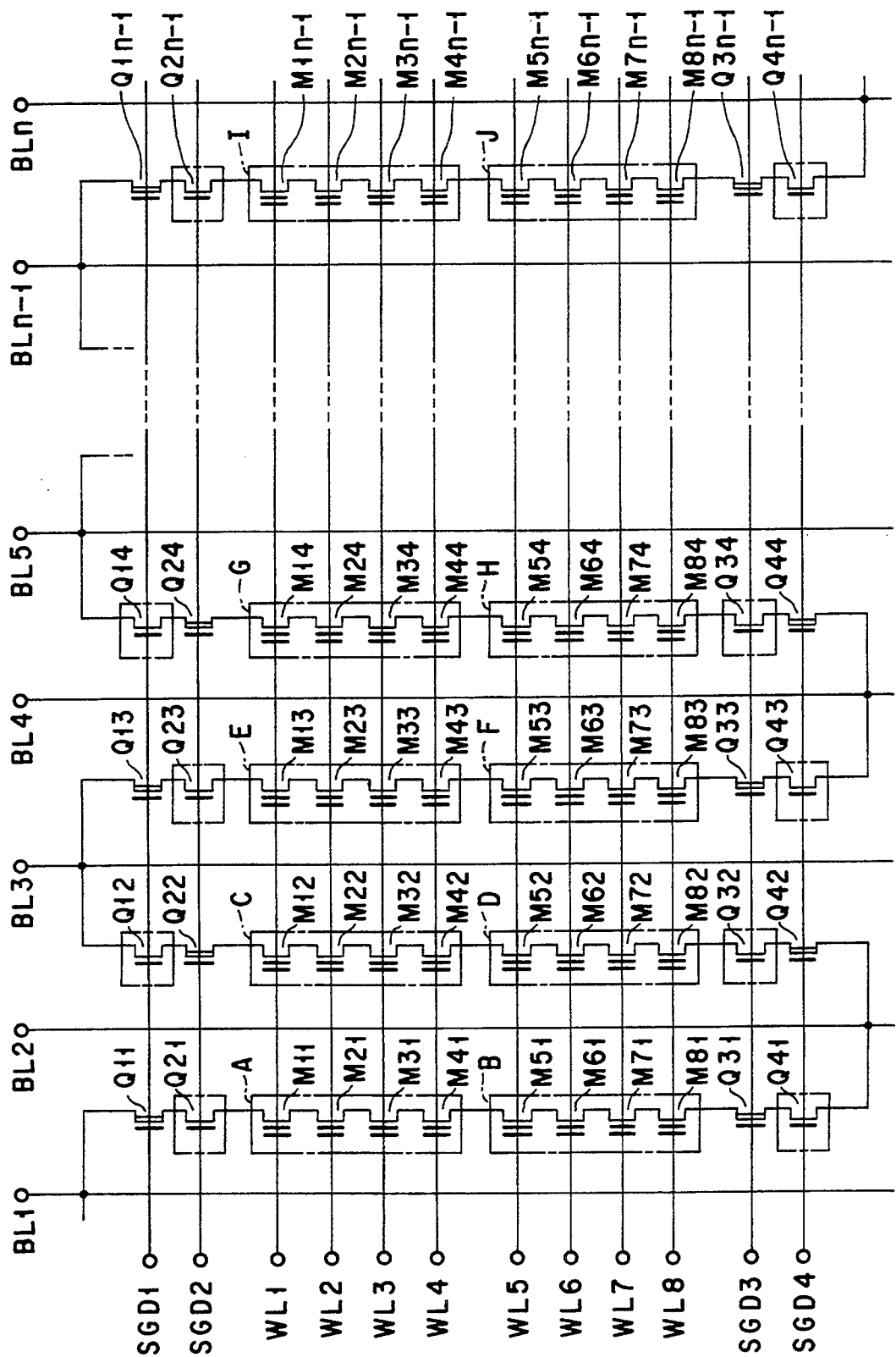
FIG. 6 is a circuit diagram of the embodiment of FIG. 5.
Figure 8A:
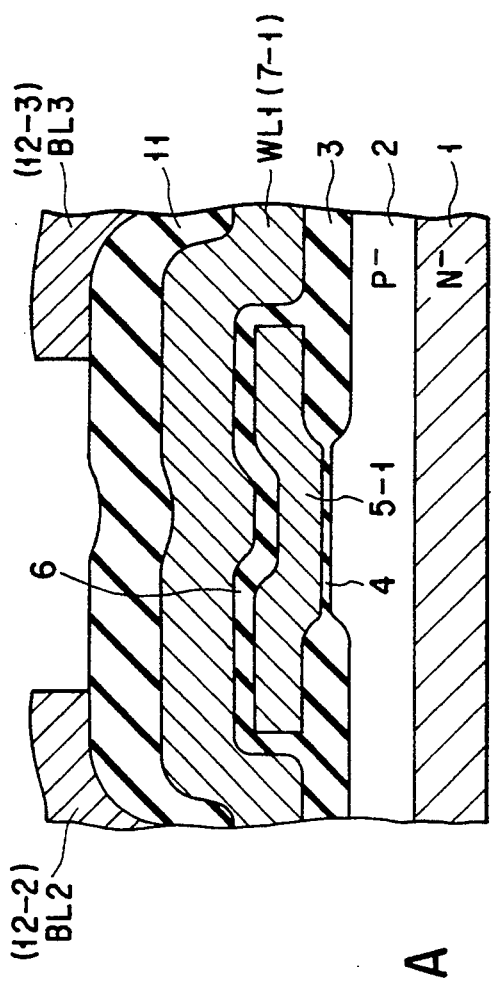
FIG. 8A is a sectional view taken along line 8A—8A of FIG. 7.
Figure 8B:
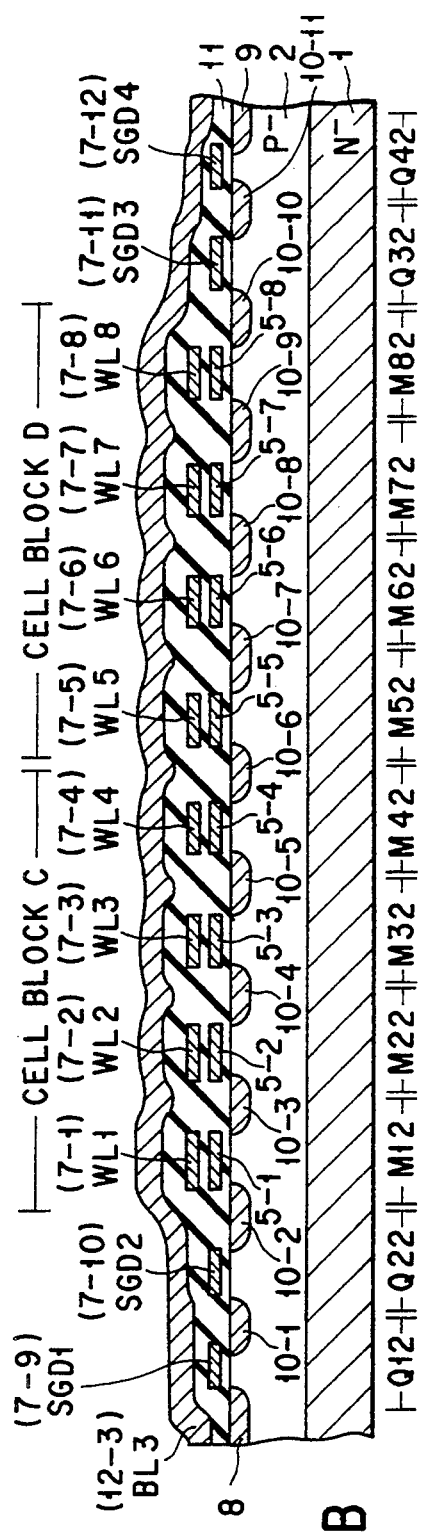
FIG. 8B is a sectional view taken along line 8B—8B of FIG. 7.
Figure 9:
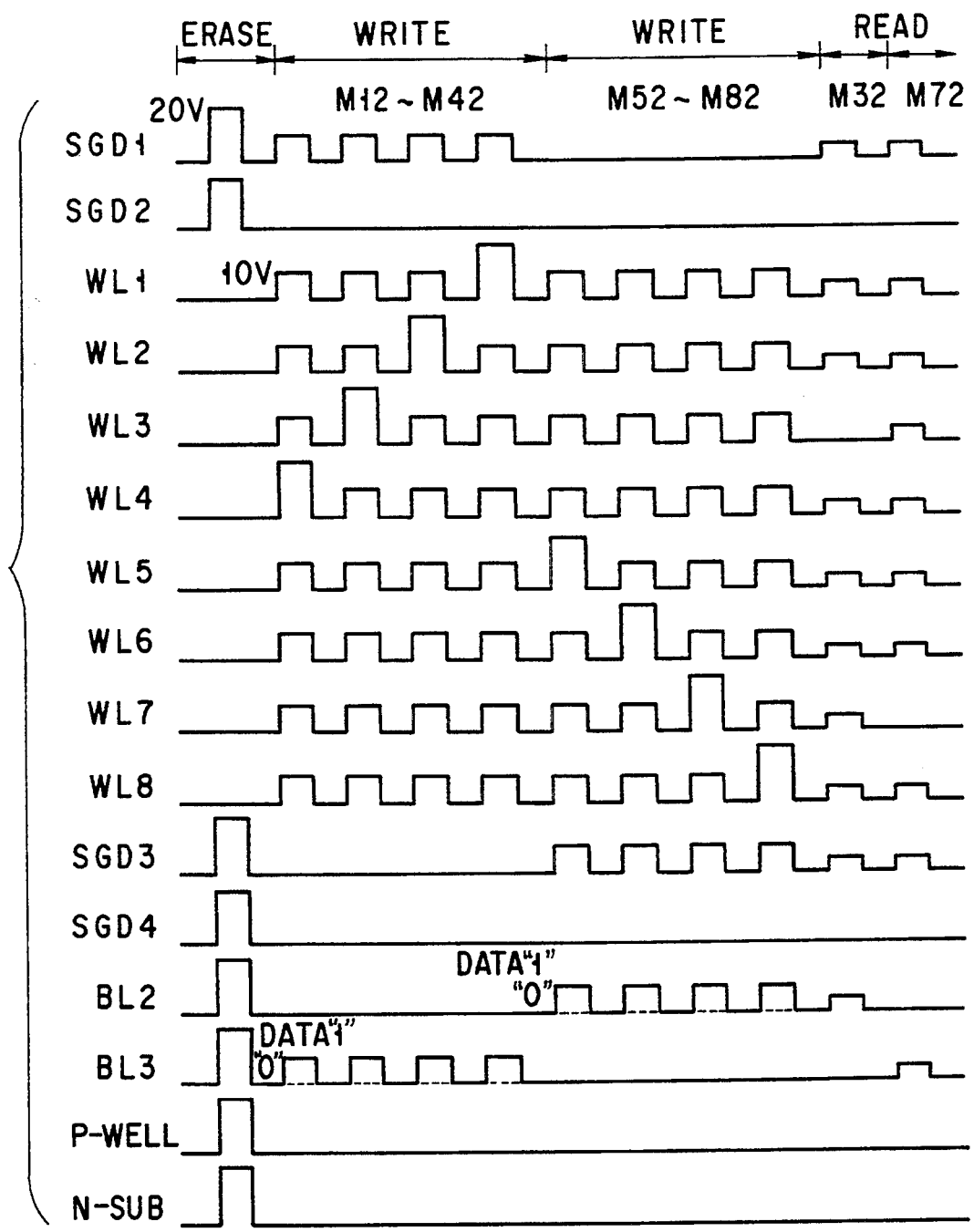
FIG. 9 is a timing chart illustrating the operation of the first embodiment of FIG. 5.

FIG. 5 is a schematic block diagram of a first embodiment of NAND-type EEPROM according to the invention, FIG. 6 is a circuit diagram of the first embodiment and FIG. 7 is a patternized plan view of the embodiment, whereas FIGS. 8A and 8B are sectional views respectively taken along lines 8A—8A and 8B—8B in FIG. 7 and FIG. 9 is a timing chart illustrating the operation of the embodiment.

As seen in FIG. 5, lines BL1 through BLn are arranged in parallel relative to one another. NAND-type cell blocks A and B are connected in series between the lines BL1 and BL2, NAND-type cell blocks C and D are connected in series between the lines BL2 and BL3 and so on. At the other end, NAND-type cell blocks I and J are connected between the lines BLn-1 and BLn. The cell block A and the line BL1 are electrically connected with each other by way of a switch Q21 that operates to allow or block a passage of signals through a line SGD2 while the cell block B and the line BL2 are connected with each other by way of another switch Q41 that operates to allow or block a passage of signals through a line SGD4.

Similarly, the cell block D and the line BL2 are electrically connected with each other by a switch Q32 that operates to allow or block a passage of signals through the line SGD3 while the cell block C and the line BL3 are connected with each other by a switch Q12 that operates to allow or block a free passage of signals through a line SGD1.

The word lines WL1 though WL4 are commonly used for the cell blocks A, C, E, G, . . . , I, whereas the word lines WL5 through WL8 are commonly used for the cell blocks B, D, F, H, . . . , J.

The arrangement of cell blocks A through D is repeatedly used in this embodiment. For instance, the cell blocks E through H has a configuration same as that of the cell blocks A through D.

The embodiment has a circuit configuration as described below in detail.

Referring to FIG. 6, each of the cell blocks A through J comprises a plurality of nonvolatile memory cells "M" having a floating gate between the respective gates or word lines WL1 through WL8 and the substrate and connected in series between the related ones of the lines BL1 through BLn. More specifically, in this embodiment, four memory cells "M" are connected in series in each cell block. Each of the switches Q21, Q41, Q12, Q32 and so on is formed by a MOSFET having a gate constituted by lines SGD1 through SGD4. The source and the drain of each of the MOSFETs are respectively connected to the related one of the lines BL1 through BLn and that of the cell blocks A through J. A normally on switch Q11 is linked to the contact point of the wire connecting the switch 21 and the line BL21 and the line SGD1. The switch Q11 is constituted by a depression type MOSFET employing the line SGD1 for its gate. Similarly, a normally-on switch Q31 is linked to the contact point of the wire connecting the switch 41 and the cell block B and the line SGD3. The switch Q31 is also constituted by a depression-type MOSFET employing the line SGD3 for its gate. As seen in FIG. 6, switches Q22, Q42, Q13, Q33, Q24, Q44, . . . Q1n-1, Q3n-1 are so many normally-on switches, although they are not shown in FIG. 5.

Now, the patternized arrangement of elements on the semiconductor substrate of the above embodiment will be described mainly in terms of the cell blocks C and D that are connected in series between the lines BL2 and BL3.

Referring to FIGS. 7, 8A and 8B, a low concentration $P^-$-type well region 2 is formed on a low concentration $N^-$-type silicon substrate 1. Eight memory cells M12 through M82 and four switches (hereinafter referred to as selection gates) Q12 through Q42 are arranged in an element region disposed on the well region 2 and surrounded by an element separating insulation film 3. As illustrated in FIGS. 5 and 6, the memory cells M12 through M42 form a cell block C, whereas memory cells M52 through M82 constitute a cell block D.

Each of the memory cells M12 through M82 comprises a floating gate 5 (related one of floating gates 5-1 through 5-8) formed by a first layer polycrystalline silicon film disposed on the well region 2 with a first gate insulation film 4 inserted therebetween and a control gate 7 (related one of control gates 7-1 though 7-8) disposed on the floating gate 5 with the interposition of another insulation film 6 therebetween. The gate electrodes 7-9 through 7-12 of the selection gates Q12 through Q42 are formed by a second layer polycrystalline silicon film along with the control gates 7-1 through 7-8 of the memory cells M12 through M82 and prepared by a patterning operation simultaneously. The control gates 7-1 through 7-8 of the memory cells are extended along the rows of the memory cells to respectively make word lines WL1 through WL8. The gate electrodes 7-9 through 7-12 of the selection gates Q12 through Q42 are respectively connected to lines SGD1 through SGD4. An N-type diffusion layer 8 and a P-type diffusion layer 9 are formed at respective ends of the cell blocks C and D. The first selection gate Q12 and the second selection gate Q22 are connected by an N-type diffusion layer 10-1, the second selection gate Q22 and the memory cell M12 are connected by an N-type diffusion layer and so on. The memory cell M82 and the third selection gate Q32 are connected by an N-type diffusion layer 10-10 and the third and fourth selection gates Q32 and Q42 are connected by an N-type diffusion layer 10-11. The well region 2 is covered by a CVD insulation film 11, through which a contact hole is bore, and connected to aluminum lines 12-1 through 12-9 rectangularly intersecting the word lines WL. The aluminum lines 12-1 through 12-9 make respective bit lines BL1 through BL9.

A drain diffusion layer 8 which is common to the selection gate Q13 (normally-on switch) is connected to the bit line BL3. Another drain diffusion layer 9 which is common to the selection gate Q41 and arranged reversely relative to the word lines is connected to the bit line BL2.

Now, the operation of the embodiment will be described particularly in terms of the cell blocks C and D connected in series between the lines BL1 and BL3.

A threshold voltage is established for the memory cells of each NAND cell block by applying a high voltage between the control gates 7 and the well region 2 to force an exchange of electric charges between the floating gates 5 and the well region 2.

For example, data may be erased when electrons are discharged form the floating gates 5 to the well region 2. A condition where the floating gates 5 are devoid of electrons as they are discharged from there is defined as a data "1" status. When a data "1" status exists, the threshold voltage level is shifted to approximately $-2$ V.

Conversely, data may be written when electrons when electrons are injected into the floating gates 5 and a condition where the floating gates 5 are full of electrons as they are injected into there is defined as a date "0" status. When a data "0" status exists, the threshold voltage level is shifted to approximately 2 V.

Firstly, the operation of erasing data in the embodiment will be described.

When the data stored in the memory cells M12 through M82 of the cell blocks C and D are collectively erased, the voltage of the word lines WL1 through WL8 are made equal to 0 V and that of the well region (P-WELL in FIG. 9) and the substrate (N-SUB in FIG. 9) is raised to 20 V, while that of the lines SGD1 through SGD4 is made equal to 20 V and that of the lines BL2 and BL3 is also made equal to 20 V. Under this condition, the threshold values for the memory cells M12 through M82 are shifted into negative to become approximately 2 V to produce a data "1" status.

Alternatively, the data stored in each block cell may be separately erased in a manner as described below. Assume that the data stored in the memory cells M12 through M42 of the cell block C are to be erased without erasing the data in the memory cells M52 through M82. Then, 20 V is applied to the word lines WL5 though WL8 while the word lines WL1 through WL4 remain at 0 V. Consequently, the threshold value is shifted into negative to become approximately 2 V only for the memory cells M12 through M42 to produce a data "1" status, while the data in the memory cells M52 through M82 are saved.

When, on the other hand, the data stored in the memory cells M52 through M82 of the cell block D are to be erased without erasing the data in the memory cells M12 through M42, then 20 V is applied to the word lines WL1 though WL4 while the word lines WL5 through WL8 remain at 0 V. Consequently, the threshold value is shifted into negative to become approximately 2 V only for the memory cells M52through M82 to produce a data "1" status, while the data in the memory cells M12 through M42 are saved.

Secondly, the operation of writing data into the embodiment will be described.

Data can be written only on a cell block basis. In other words, the operation of writing data into the cell block C comprising memory cells M12 through M42 is separately carried out from that of writing data into the cell block D constituted by memory cells M52 through M82.

When data are written into the memory cells of the cell block C, the line BL3 which is located close to the cell block C is selected as a bit line. Then, the potential of the first line SGD1 is made equal to 10 V, while the remaining lines SGD2, SGD3 and SGD4 are held to 0 V. Consequently, the selection gate Q12 becomes ON, whereas the selection gates Q23 and Q32 are turned OFF so that only the cell blocks C and D are electrically connected to the line BL3.

When, on the other hand, data are written into the memory cells of the cell block D, the line BL2 which is located close to the cell block D is selected as a bit line. Then, the potential of the first line SGD3 is made equal to 10 V, while the remaining lines SGD1, SGD2 and SGD4 are held to 0 V. Consequently, the selection gate Q32 becomes ON, whereas the selection gates Q12 and Q41 are turned OFF so that only the cell blocks C and D are electrically connected to the line BL2.

The operation of writing data starts from the memory cell located remote from the line BL that operates as a bit line. In the cell block C, for example, the memory cell M42 is most remote from the line BL3 and the memory cells M32, M22 and M12 are located closer to the line BL3 in the mentioned order. In the cell block D, on the other hand, the memory cells M52, M62, M72 and M82 are located more remote from the line BL2 in the mentioned order.

For writing data, only the potential of the word line that operates as a gate for the selected memory cell is raised to 20 V, while that of all the remaining word lines are held to 10 V. If, now, the memory cell M42 is to be selected for data storage, the potential of the word line WL4 is raised to 20 V and that of the remaining word lines WL1 through WL3 and WL5 through WL8 are held to 10 V as shown in FIG. 9. Consequently, the memory cell M42 is selected and a data is stored therein. When the potential of the word line WL3 is raised to 20 V and that of the remaining word lines WL1, WL2 and WL4 through WL8 are held to 10 V, the memory cell M32 is selected and a data is stored therein. When the potential of the word line WL2 and that of the word line WL1 are sequentially raised to 20 V, data are stored sequentially in the memory cells M42, M32, M22 and M12.

The reason why the memory cell located most remote from the line WL that operates as a bit line is selected first for data storage is to avoid any positive value for the threshold voltage of the unselected memory cells closer to the line WL that operates as a bit line because a positive threshold voltage value represents a condition where a data writing operation is going on and, if the threshold voltage of the unselected memory cells has a positive value, the actual voltage of those unselected memory cells may fall to reduce the intermediate voltage of 10 V being transferred from the bit line and give rise to memory errors.

When data "0" is to be stored, the potential of the line BL that operates as a bit line is reduced to 0 V. Referring to FIG. 9, if the memory cell M42 is selected for storing the data, the potential of the line BL3 is held to 0 V and only the word line WL4 is selected and its potential is raised to 20 V. Consequently, electrons are injected into the floating gate of the memory cell M42. If data "0" is to be written into the memory cell M42 after erasing the data stored in it, the threshold voltage of the memory cell M42 is shifted from the value of approximately −2 V (data "1" status) to approximately 2 V (data "0" status), indicating that data "0" is stored in the written in cell M42.

When, on the other hand, data "1" is to be stored, the potential of the line BL that operates as a bit line is reduced to 10 V. Referring to FIG. 9, if the memory cell M42 is selected for storing the data, the potential of the line BL3 is made equal to 10 V and only the word line WL4 is selected and its potential is raised to 20 V. Since the potential of the floating gate of the memory cell M42 can be made lower than the potential when the line BL3 is made equal to 0 V under this biased condition, consequently, electrons are injected into the floating gate of the memory cell M42. If data "1" is to be written into the memory cell M42 after erasing the data stored in it, the threshold voltage of the memory cell M42 is remains to be approximately −2 V (data "1" status) to approximately 2 V (data "0" status), indicating that data "1" is written, or kept, in the memory cell M42.

Finally, the operation of reading data from the embodiment will be described.

For reading data, contrary to data writing operation, the line located most remote from the cell block from which the stored data are retrieved is used as a bit line and the line closest to the cell block is used as a source line. When, for example, the data stored in the cell block C are retrieved, the line BL2 is made to operate as a bit line, whereas the line BL3 is used as a source line. When, on the other hand, the data stored in the cell block D are retrieved, the line BL3 is used as a bit line, whereas the line BL2 is made to operate as a source line.

Referring to FIG. 9 for more specific description, when the memory cell M32 of the cell block C is specifically selected for data retrieval. The potentials of the lines BL2, BL3 and the word line WL3 are made equal to 5 V, 0 V and 0 V respectively and those of the remaining word lines WL1, WL2 and WL4 through WL8 are held to 5 V, whereas the first and third lines SGD1 and SGD3 are made equal to 5 V and the remaining lines SGD2 and SGD4 are reduced to 0 V. Consequently, the selection gates Q12 and Q32 become ON, while the selection gates Q23 and Q41 are turned OFF so that only the cell blocks C and D are connected in series between the lines BL2 and BL3. Since the line BL3 is held equal to 0 V, it operates as a source line. Thus, if the threshold value of the memory cell M32 is positive, any current running therethrough is cut off. If it is negative, on the contrary, a data "0" or "1" status can be determined as a current runs between lines BL2 and BL3.

When, on the other hand, the memory cell M72 of the cell block D is specifically selected for data retrieval, the potentials of the lines BL2, BL3 and the word line WL7 are made equal to 0 V, 5 V and 0 V respectively and those of the remaining word lines WL1 through WL6 and WL8 are held to 5 V, whereas the first and third lines SGD1 and SGD3 are made equal to 5 V and the remaining lines SGD2 and SGD4 are reduced to 0 V. Consequently, the selection gates Q12 and Q32 become ON, while the selection gates Q23 and Q41 are turned OFF so that only the cell blocks C and D are connected in series between the lines BL2 and BL3. Since the line BL3 is held equal to 0 V, it operates as a source line. Thus, as in the case of the memory cell M32 described above, if the threshold value of the memory cell M72 is positive, any current running therethrough is cut off. If it is negative, on the contrary, a data "0" or "1" status can be determined as a current runs between lines BL3 and BL2.

The above described manner of line selection for data retrieval is designed to avoid any reduction in the level of the current running between the bit line and the source line for the selected memory cell that may occur due to a floated source voltage by suppressing the number of memory cells connected between the selected memory cell and the source line when the threshold potential level of the selected memory cell is negative to cause an electric current to run between the bit line and the source line. Any reduction in the level of the current running through a selected memory cell may prolong the time and reduce the potential difference required discriminating data read from the selected memory cell.

If a semiconductor memory device of the type under consideration is not expected to meet rigorous requirements in terms of the time required for data retrieval, the lines located closest to and most remote from the cell block from which data are retrieved may be used to operate as a bit line and a source line respectively as in the case of data storage.

If such is the case, the circuit arrangement around the memory cells may be significantly simplified since the lines can be used to operate in a coordinated manner for both data storage and data retrieval.

On the contrary, the lines BLs located most remote from and closest to the selected cell block may be used as a bit line and a source line respectively for both data storage and data retrieval.

In such a case again, the circuit arrangement around the memory cells may be significantly simplified since the lines can be used to operate in a coordinated manner for both data storage and data retrieval. Additionally, the advantage of a high data retrieving rate and data retrieval with a large potential difference is secured because the resistance between the source line and the selected memory cell is significantly reduced for data reading operation.

Now, a second embodiment of NAND type EEPROM according to the invention will be described below in detail.

Figure 10:
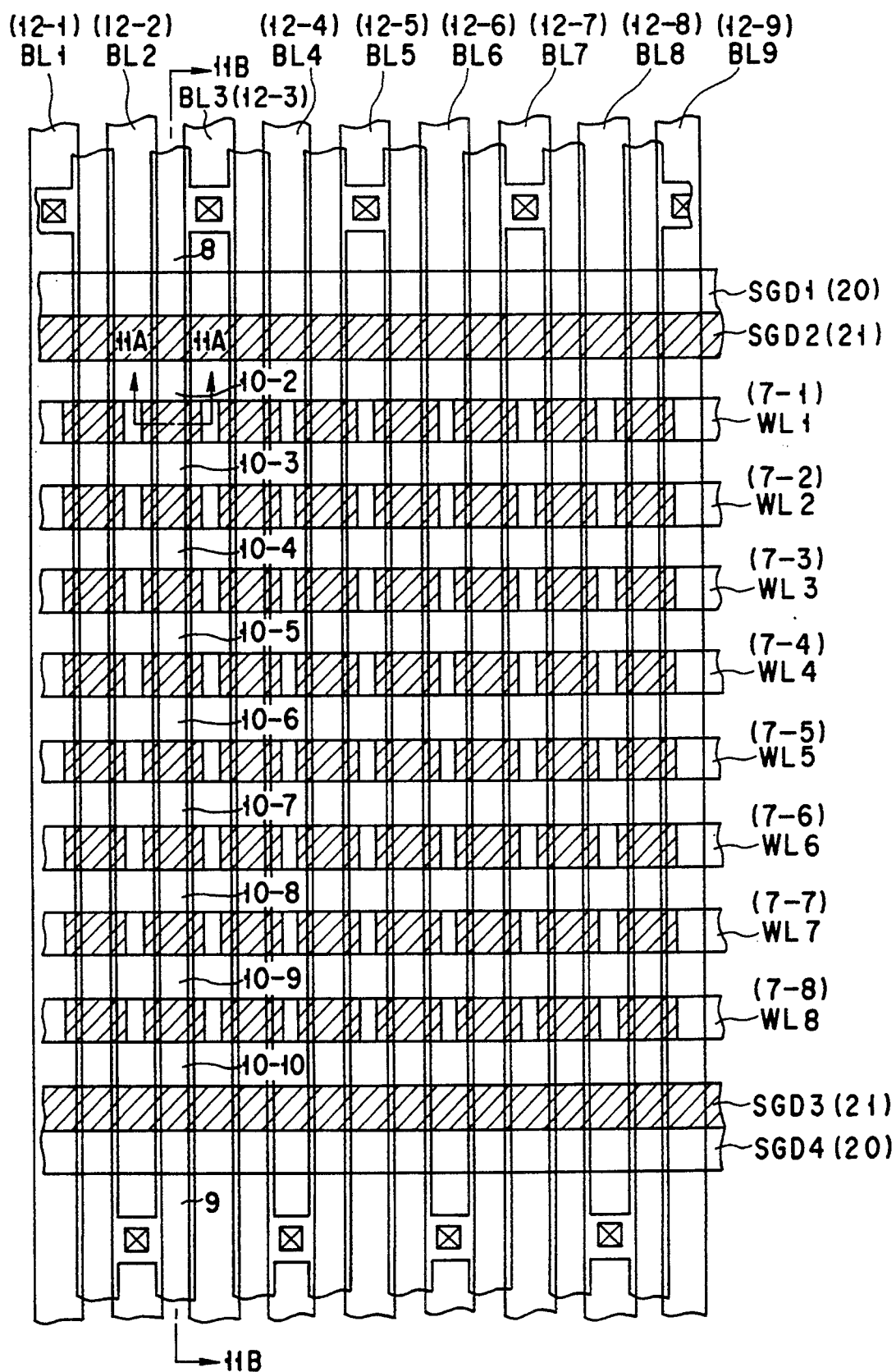
FIG. 10 is a patternized plan view of a second embodiment of NAND type EEPROM according to the invention.
Figure 11A:
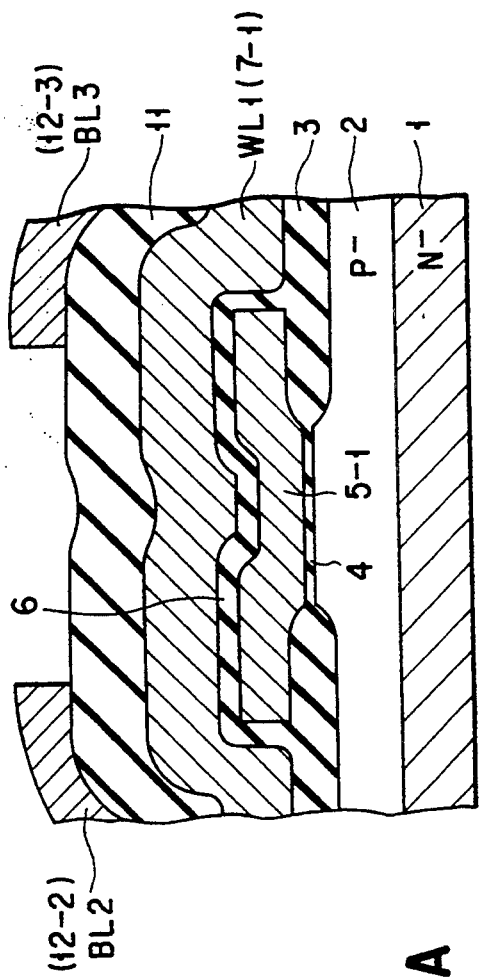
FIG. 11A is a sectional view taken along line 11A—11A of FIG. 10.
Figure 11B:
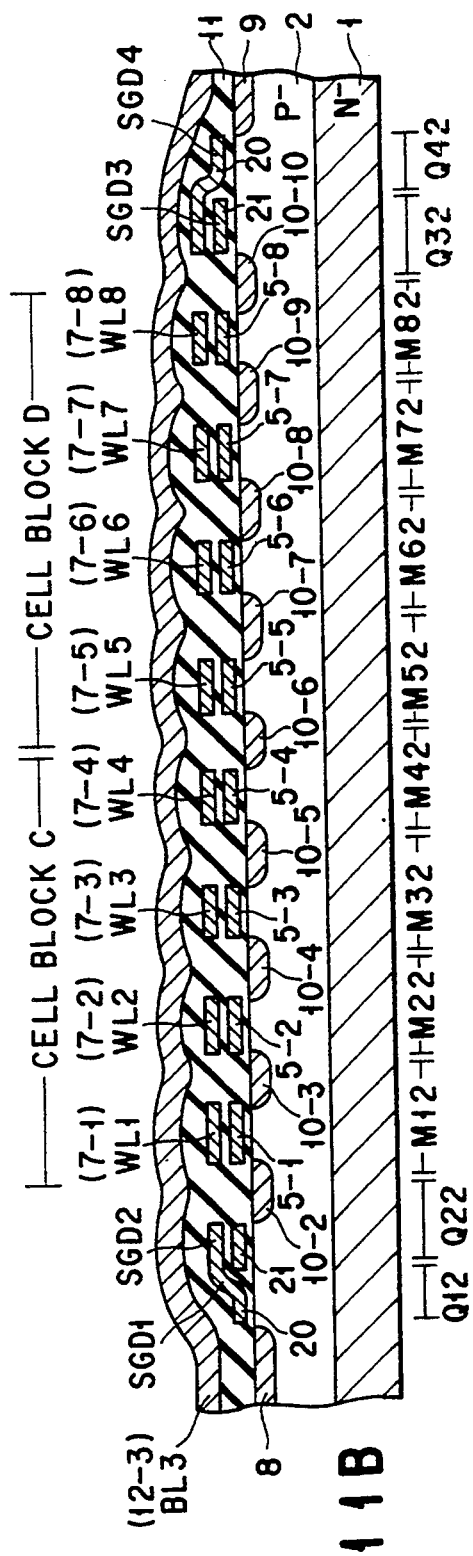
FIG. 11B is a sectional view taken along line 11B—11B of FIG. 10.

FIG. 10 is a patternized plan view of the embodiment, whereas FIGS. 11A and 11B are sectional views respectively taken along lines 11A—11A and 11B—11B in FIG. 10.

The second embodiment of NAND-type EEPROM of the invention has selection gates constituted by off-set type transistors.

Referring to FIGS. 10, 11A and 11B, each of the off-set transistors is formed by forming both first and second layer polycrstalline silicon films 21, 20 on a well region 2 with the second layer polycrystalline silicon film 20 partly laid on the first layer polycrystalline silicon film 21. Lines SGD1 and SGD2 are formed by the second layer polycrystalline silicon film 20, whereas lines SGD2 and SGD3 are formed by the first layer polycrystalline silicon film 21.

Referring particularly to FIG. 11B, illustrating the embodiment in cross section taken along line BL3, selection gate Q12 is constituted by a transistor having its gate formed by the second layer polycrystalline silicon film 20. whereas selection gate Q22 is constituted by a transistor having its gate formed by the first layer polycrystalline silicon film 21. Similarly, selection gate Q32 is constituted by a transistor having its gate formed by the first layer polycrystalline silicon film 21, whereas selection gate Q42 is constituted by a transistor having its gate formed by the second layer polycrystalline silicon film 20. If the selection gate Q22 and Q32 are made to be normally-on, the block diagram of FIG. 5 is applicable to this embodiment and a circuit configuration equivalent to that of FIG. 6 is obtained.

With such an arrangement, since the line SGD2 may be laid on the line SGD1 on the surface of the substrate or vice versa and the transistors Q12 and Q22 and Q32 and Q42 may be connected with each other respectively to eliminate diffusion the layer 10-1, it will be possible to further down-size the device.

The second embodiment operates in much the same way as the first embodiment.

Now, an alternative method of data storage operation of the second embodiment will be described.

In the data storage operation described above by referring to FIG. 9, the unselected cell blocks A, B, E and F located adjacent to the selected cell blocks C and D for data storage are brought into a floating state so that no data may be mistakenly stored in any of the unselected cell blocks A, B, E and F while data are being written into the cell blocks C and D.

The alternative method of data storage operation described below also provides an alternative method effective in preventing data from being mistakenly stored in any of the unselected cell blocks.

FIG. 12 is a timing chart illustrating the alternative method of data storage operation of the second embodiment. Note that, while this method also covers the operation of data erasure and that of data retrieval, these aspects of the method are not described here because they are similar to their counterparts of FIG. 9.

Referring to FIG. 12, it is assumed here that the operation of data writing according to this alternative method is carried out on a cell block basis for the cell blocks C and D respectively comprising memory cells 12 through M42 and M52 through M82 as in the case of FIG. 9.

When data are written in the memory cells of the cell block C, the line BL3 located closest to the cell block C is selected as a bit line as shown in FIG. 12. Then, the potentials of the first and fourth lines SGD1 and SGD4 are raised to 10 V, while those of the remaining lines SGD2 and SGD3 are held to 0 V. Consequently, the selected cell blocks C and D are electrically connected to the line BL3. At the same time, the unselected cell blocks A and B and E and F are electrically connected to the lines BL2 and BL4 respectively.

When, on the other hand, data are written in the memory cells of the cell block D, the line BL2 located closest to the cell block D is selected as a bit line as shown in FIG. 12. Then, the potentials of the second and third lines SGD2 and SGD3 are raised to 10 V, while those of the remaining lines SGD2 and SGD3 are held to 0 V. Under this condition, the selection gates Q32, Q21 and Q23 become ON, while the selection gates Q12, Q41 and Q43 are turned OFF. Consequently, the selected cell blocks C and D are electrically connected to the line BL3. At the same time, the unselected cell blocks A and B and E and F are electrically connected to the lines BL1 and BL3 respectively.

The procedure for writing data into the memory cells and the method of selecting a particular memory cell for data storage are similar to those as described earlier by referring to FIG. 9. The only difference is that the potentials of the lines BL2 and BL4 are made equal to 10 V when the memory cells M12 through 42 of the cell block C are selected for data storage, whereas the potentials of the lines BL1 and BL3 are made equal to 10 V when the memory cells M52 through 82 of the cell block D are selected for data storage.

With the above data writing method, the voltage of 10 V is transferred from the line BL to the memory cells connected to the word line having a potential raised to 20 V for data storage and contained in the unselected cell blocks so that the memory cells of the unselected cell blocks are held under a condition equivalent to the one where data "1" is written. In other words, if data "1" is written after erasing the stored data in a target memory cell, the threshold voltage level of the memory cells of the unselected cell blocks remains to be approximately −2 V (indicating a data "1" status) so that a data "1" status is held in those memory cells. Thus, the memory cells of the unselected cell blocks A, B, E and F can constantly maintain their data to prevent any data from being mistakenly written into any of those memory cells.

FIG. 13 is a floor plan view of the NAND-type EEPROM according to the present invention.

As shown in FIG. 13, a memory cell array comprises a plurality of memory blocks, one of which being typically shown in FIG. 5. A column circuitry decodes column address signals to control bit lines BL1 to BLn, as shown in the timing charts of FIG. 9 or FIG. 12.

A row decoder decodes row address signals to control word lines WL1 to WL8 and select gate lines SGD1 to SGD4, as shown in the timing charts of FIG. 9 or FIG. 12.

FIG. 14 is a block diagram of the column circuitry shown in FIG. 13.

As seen in FIG. 14, the bit lines are provided with respective source/drain switching circuits, sense amplifiers and data latch circuits. Of the switching circuits, those connected to the odd-numbered bit lines BL1, BL3, BL5, ..., BLn-1 are designed to receive source/drain control signals (I), whereas those connected to the even-numbered bit lines BL2, BL4, BL6, ..., BLn are so arranged as to receive source/drain control signals (II).

Now, the operation of the column circuitry of FIG. 14 will be described, assuming that the memory cell M81 shown in FIG. 6 is selected.

Figure 15:
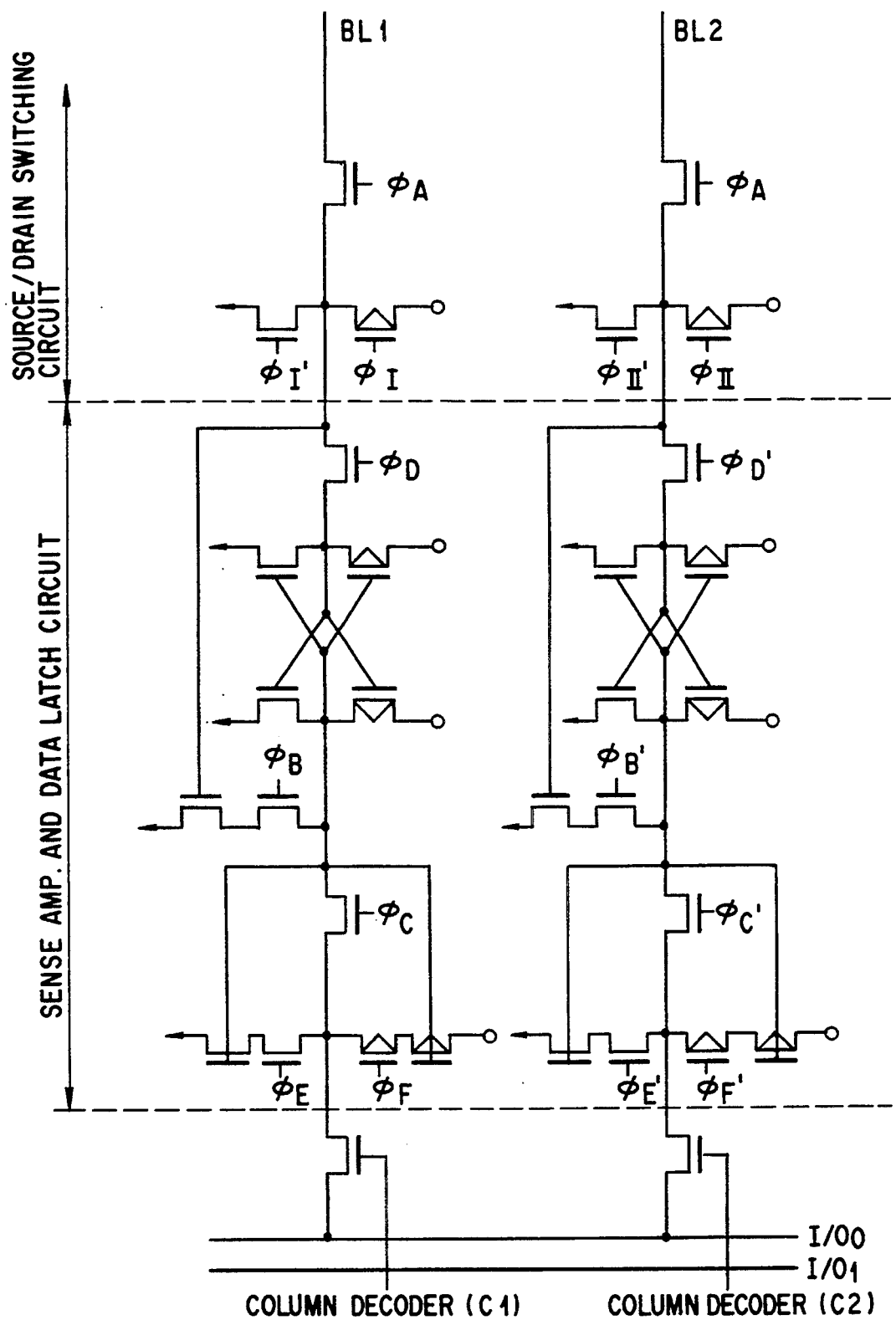
FIG. 15 is a circuit diagram of the blocks shown in FIG. 14.
Figure 16:
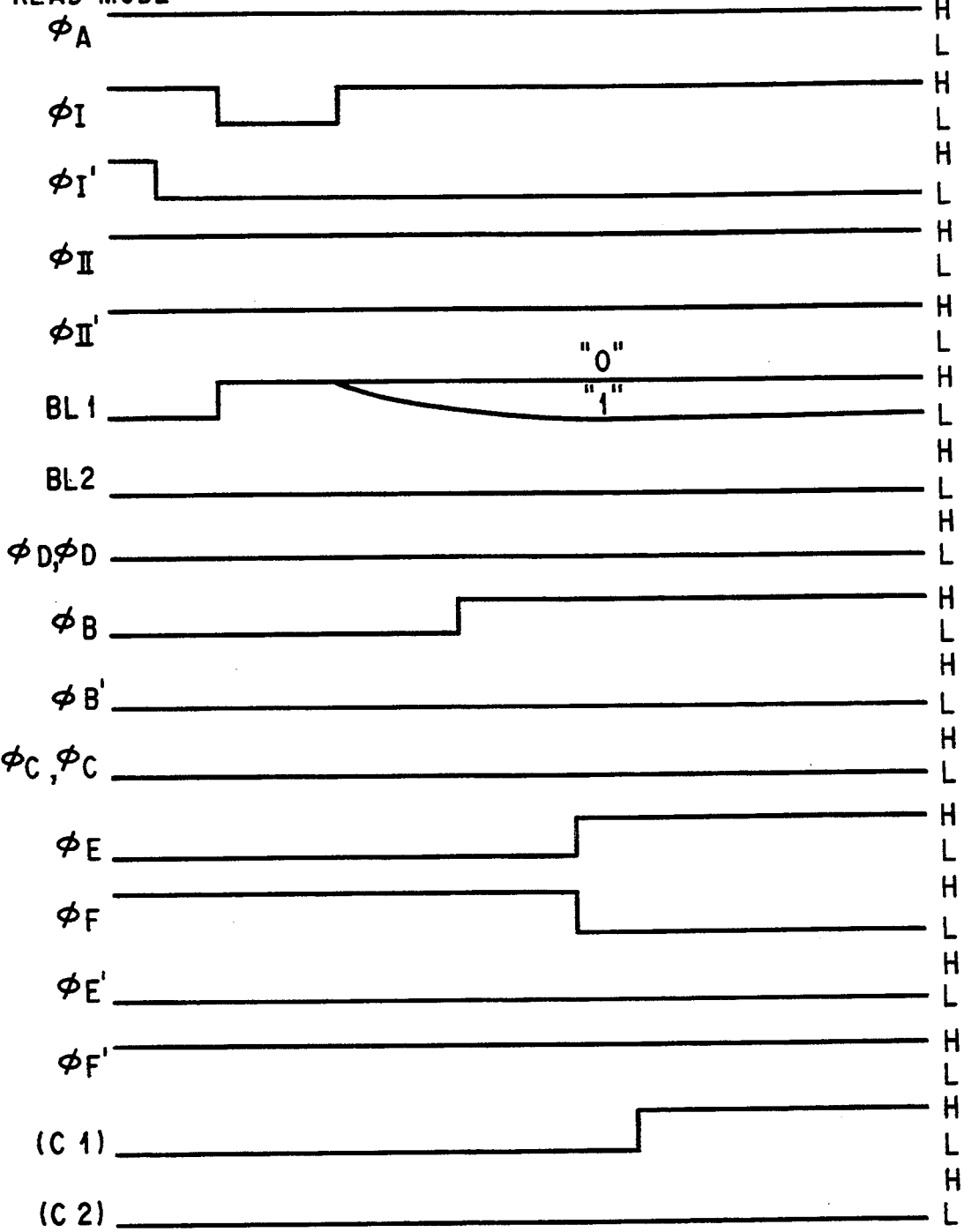
FIG. 16 is a timing chart fox data reading operation of the circuits shown in FIG. 15.
Figure 17:
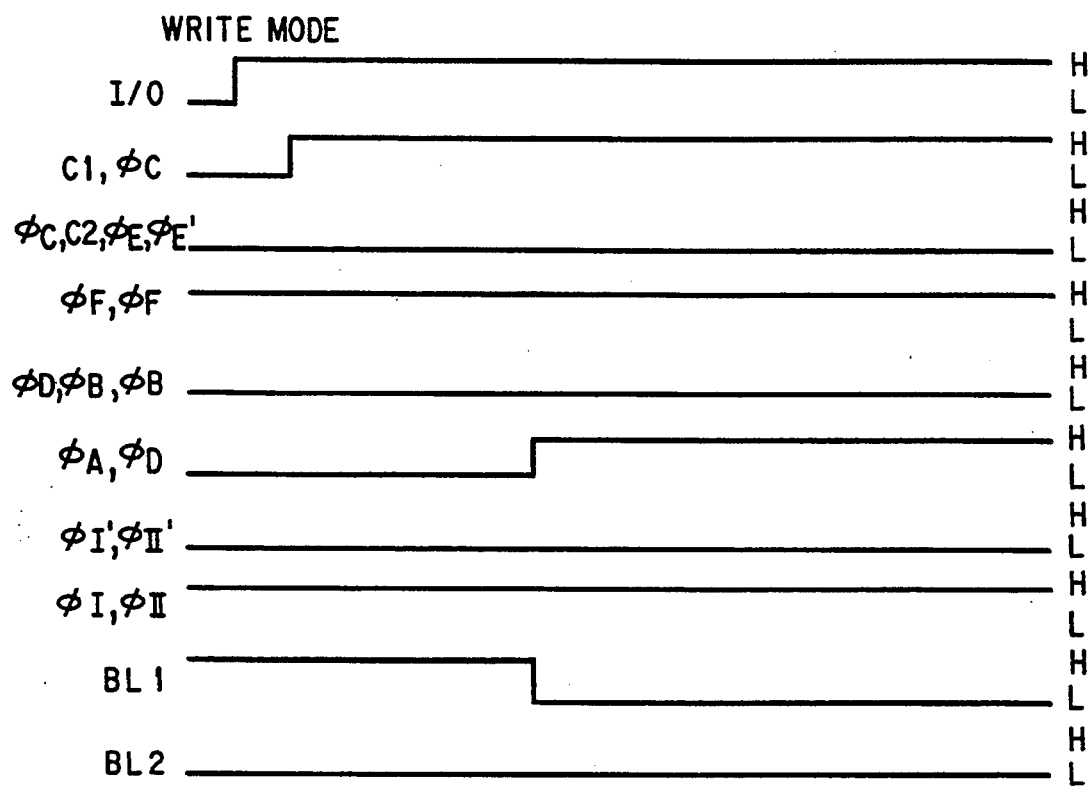
FIG. 17 is a timing chart for data writing operation of the circuits shown in FIG. 15.

FIG. 15 is a detailed circuit diagram of the switching circuits, sense amplifiers and data latch circuits of FIG. 14 and FIG. 16 is a timing chart for data reading operation (READ) of the circuits of FIG. 15, whereas FIG. 17 is a timing chart for data writing operation (WRITE) of the circuits of FIG. 15.

As the memory cell MS1 shown in FIG. 6 is selected, the bit liens BL1 operates as the drain of the memory cell while the bit lines BL2 functions as the source of the memory cell.

The column circuitry operates in a manner as described below for reading data.

The electric potential of the bit line BL1 is made to float when the source/drain control signal $\phi I$ is set to level "H" and the source/drain control signal $\phi I'$ is set to level "L". The electric potential of the bit lines BL2 is made equal to that of the ground when the source/drain control signal $\phi II$ is set to level "L" and the source/drain control signal $\phi II'$ is set to level "H". Then, the bit line BL1 is precharged to get to level "H" as the potential of the bit line BL1 is switched to level "L" from level "H" for a given period of time. The potential of the bit line BL2 remains equal to the ground potential during the data reading operation. Then, the data stored in the memory cell M81 is sent to the bit line BL1 as the selection gate is turned on. The potential of the 0it line BL1 gets to either level "H" or level "L" depending on the data sent to the bit line BL1. Thereafter, the flip-flop operating as a sense amplifier is made to latch data either for level "H" or level "L" by turning signal $\phi a$ to level "H" depending on the potential of said bit line BL1. Then, the latched data is sent out to the input/output (I/O) line as the signals $\phi E$ and $\phi F$ are turned respectively to levels "H" and "L" while the output signal C1 of the column decoder is turned to level "H".

Now, the data stored in the memory cell M81 can be read on the I/O line.

Next, the data writing operation of the circuitry will be described.

The electric potential of the I/O line is set either to level "H" or level "L" depending on the data to be written in. Assume here that data "0" is to be written in the memory cell M81.

Figure 18:
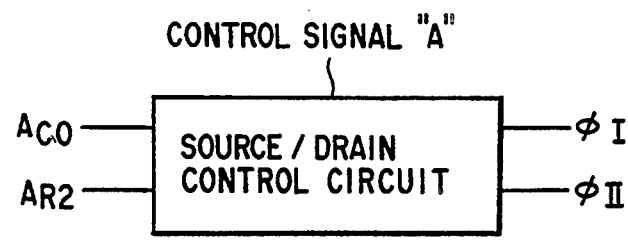
FIG. 18 is a block diagram of the source/drain control circuit shown in FIG. 13.

FIG. 18 is a block diagram of the source/drain circuit shown in FIG. 13.

Referring to FIG. 18, the lowest order address $A_{C0}$ of the column address and the third order address $A_{R3}$ of the row address are given to the source/drain control circuit respectively as a column address signal and a row address signal along with the control signal A. Of these, the address $A_{R3}$ is sued for selecting an upper/lower position in the NAND-cell. The source/drain control circuit outputs source/drain control signals $\phi I$ and $\phi II$ on the basis of the these input signals.

Figure 20:
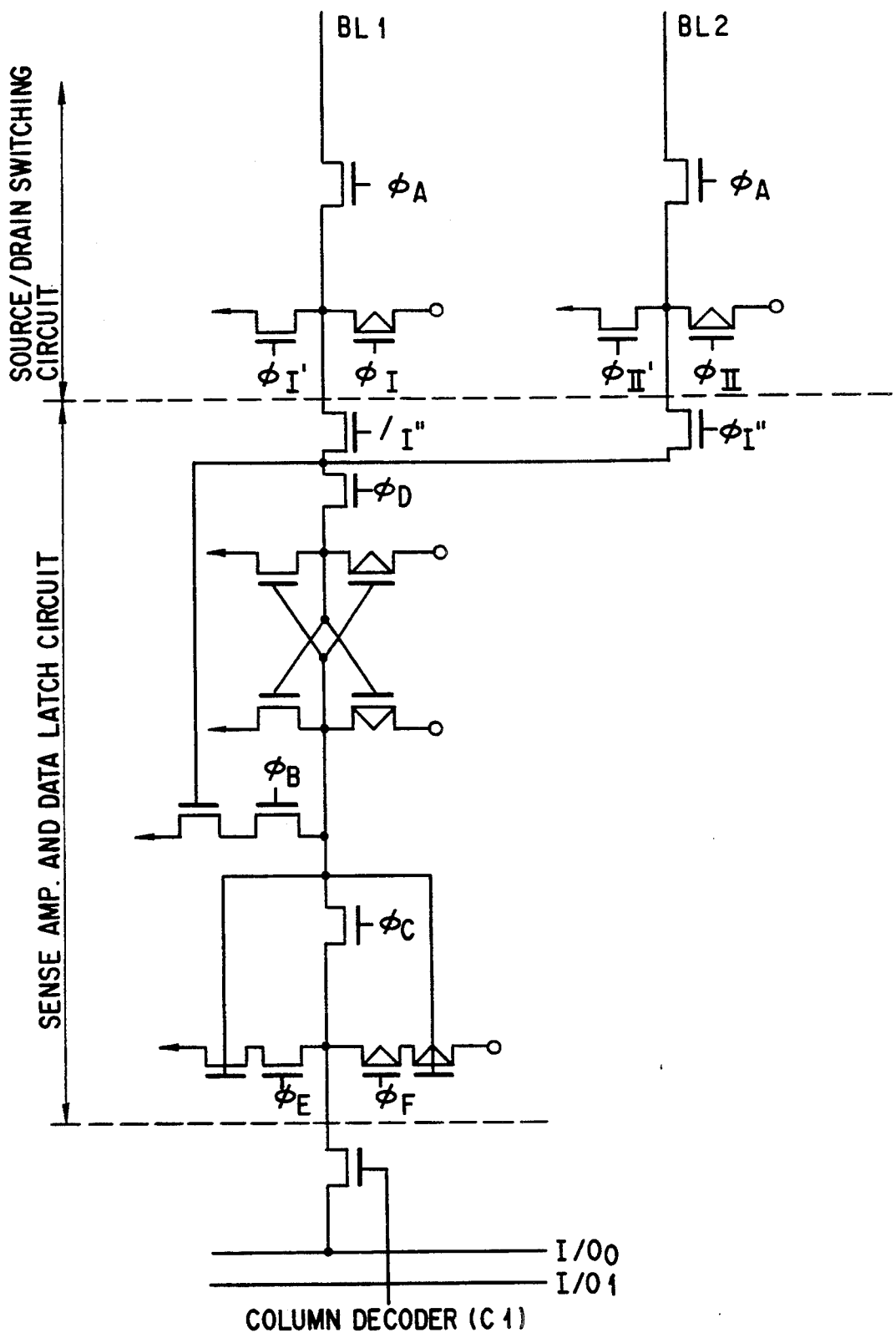
FIG. 20 is a circuit diagram of the blocks shown in FIG. 19.

FIG. 19 shows a block diagram of a column circuitry obtained by modifying the column circuitry of FIG. 13. FIG. 20 is a detailed circuit diagram of the switching circuits, sense amplifiers and data latch circuits of FIG. 19.

In this modified column circuitry, a sense amplifier and a data latch circuit are shared by adjacent bit lines, e.g. BL1 and BL2, in order to reduce the overall area required for the component circuits of the circuitry. This modified column circuitry differs from the circuitry of FIG. 14 in that either the source or the drain is selected by the source/drain control signals $\phi I$ and $\phi II$.

This above described modified column circuitry is advantages in that it can reduce the overall area required to accommodate the component circuits. The sense amplifier and the data latch circuit connected to the bit lines BL1 and BL2 and these connected to the bit lines BL3 and BL4 may alternatively be arranged in juxtaposition relative to each other with the memory cell array disposed therebetween.

With either of the above described first and second embodiments of semiconductor memory device according to the invention, one of the lines BLs located adjacent to the cell blocks connected in series for data retrieval is used as a bit line while the other line BL is used as a source line. Since the assignments of the lines BLs may be switched between the bit line and the source line depending on which of the cell blocks connected in series is selected for operation, no particular and independent source line needs to be provided and hence any contact holes to be used for such a source line can be eliminated to make the device particularly suited for an enhanced degree of integration.

It may be needless to say that the present invention is not limited to the above described first and second embodiments and various modifications and alterations may be made thereto.

For example, while the potentials of the lines SGD1 through SGD4, BL2 and BL3 are raised to 20 V in the above embodiments for data erasure as described earlier by referring to FIG. 9, they may be held in an open state and only the potentials of the well region (P-WELL) and the substrate (N-SUB) may be raised to 20 V to achieve the same data erasing effect.

While the memory cells connected in series between a pair of switches are divided into two cell blocks in the above first and second embodiments, they may be grouped into a single cell block so that the cell blocks A and D, C and D, E and F, G and H and I and J may be combined together to produce five larger cell blocks.

Thus, according to the invention, there is provided a semiconductor nonvolatile memory device particularly suited for a high degree of integration.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor nonvolatile memory device comprising:
   a first cell block having a current path and a plurality of memory cells;
   a second cell block having a current path and a plurality of memory cells, said current path of said second cell block having an end connected to a corresponding end of said current path of said first cell block;
   a first line electrically connected to the other end of the current path of said first cell block;
   a second line electrically connected to the other end of the current path of said second cell block; and
   switch means for causing said first and second lines to operate as a bit line and a source line, respectively, depending on which one of said cell blocks is selected for data retrieval.

2. A semiconductor nonvolatile memory device according to claim 1, wherein said switch means causes the first and second lines to operate as a source line and a bit line, respectively, for retrieving data from one of the memory cells of said first cell block.

3. A semiconductor nonvolatile memory device according to claim 2, wherein the memory cells of said first cell block are connected in series between said first line and an end of the current path of said second cell block, and the memory cells of said second cell block are connected in series between said second line and an end of said first cell block.

4. A semiconductor nonvolatile memory device according to claim 3, wherein all memory cells of said second cell block are made electrically conductive while data is being retrieved from one of the memory cells of said first cell block.

5. A semiconductor nonvolatile memory device according to claim 1, wherein each of the memory cells of said first and second cell blocks is constituted by a gate insulation layer and an insulated gate field effect transistor comprising an electric charge storage layer arranged in the gate insulation film, for regulating a threshold voltage level.

6. A semiconductor nonvolatile memory device according to claim 5, wherein each of the insulated gate field effect transistors has a control gate.

7. A semiconductor nonvolatile memory device according to claim 6, wherein said control gates are electrically connected to different word lines.

* * * * *